US012581787B2

(12) United States Patent
(10) Patent No.: US 12,581,787 B2
(45) Date of Patent: Mar. 17, 2026

Jeon et al.

(54) ORGANIC HOLE TRANSPORT MATERIAL DOPED WITH ACID-BASE ADDUCT, AND OPTICAL DEVICE USING SAME

(71) Applicant: KOREA RESEARCH INSTITUTE OF CHEMICAL TECHNOLOGY, Daejeon (KR)

(72) Inventors: Nam Joong Jeon, Daejeon (KR); Jang Won Seo, Daejeon (KR); Geun Jin Kim, Daejeon (KR); Seong Sik Shin, Daejeon (KR); Seung Joo Lee, Daejeon (KR); Young Woong Kim, Daejeon (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 712 days.

(21) Appl. No.: 17/997,599

(22) PCT Filed: Jul. 9, 2021

(86) PCT No.: PCT/KR2021/008848
§ 371 (c)(1),
(2) Date: Oct. 31, 2022

(87) PCT Pub. No.: WO2022/010326
PCT Pub. Date: Jan. 13, 2022

(65) Prior Publication Data

US 2023/0178307 A1 Jun. 8, 2023

(30) Foreign Application Priority Data

Jul. 9, 2020 (KR) ........................ 10-2020-0084529

(51) Int. Cl.
*H10K 30/40* (2023.01)
*H01G 9/20* (2006.01)
(Continued)

(52) U.S. Cl.
CPC ........... *H10K 30/40* (2023.02); *H01G 9/2009* (2013.01); *H10K 30/86* (2023.02); *H10K 85/111* (2023.02); *H10K 85/50* (2023.02)

(58) Field of Classification Search
CPC ...... H10K 30/40; H10K 30/86; H10K 85/111; H10K 85/50; H10K 50/155; H10K 50/15; H10K 85/60; H01G 9/2009; Y02E 10/549
See application file for complete search history.

(56) References Cited

U.S. PATENT DOCUMENTS 8,203,138 B2 * 6/2012 Takeya ................. H10K 10/471
257/E51.001
11,978,855 B2 * 5/2024 Hudak .................. H01M 4/583
(Continued)

FOREIGN PATENT DOCUMENTS

CN 105830228 A 8/2016
CN 111303590 A 6/2020
(Continued)

OTHER PUBLICATIONS

Abate, et al. "Protic Ionic Liquids as p-Dopant for Organic Hole Transporting Materials and Their Application in High Efficiency Hybrid Solar Cells," Joural of the American Chemical Society, No. 135, pp. 13538-13548 (2013).
(Continued)

*Primary Examiner* — Mark Kopec
*Assistant Examiner* — Jaison P Thomas
(74) *Attorney, Agent, or Firm* — Harness, Dickey & Pierce, P.L.C.

(57) ABSTRACT

An organic hole transport material according to an embodiment of the present disclosure is an organic hole transport material doped with an acid-base adduct, in which the acid-base adduct is formed by an acid-base reaction involving an acid and a base, and the acid contains hydrogen ions
(Continued)

($H^+$) and has the formula $H^+X^-$, where $H^+$ corresponds to a hydrogen ion, and $X^-$ corresponds to an anion and corresponds to $TFSI^-$.

6 Claims, 3 Drawing Sheets

(51) Int. Cl.

| | |
|---|---|
| ***H10K 30/86*** | (2023.01) |
| ***H10K 85/10*** | (2023.01) |
| ***H10K 85/50*** | (2023.01) |

(56) References Cited

U.S. PATENT DOCUMENTS

| | | | | |
|---|---|---|---|---|
| 2009/0092912 | A1 | 4/2009 | Wu et al. | |
| 2016/0126020 | A1* | 5/2016 | Snaith | H10K 85/60 252/500 |
| 2018/0175222 | A1* | 6/2018 | Hayakawa | H10F 77/211 |
| 2024/0264113 | A1* | 8/2024 | De Keersmaecker | G01N 27/301 |

FOREIGN PATENT DOCUMENTS

| | | | |
|---|---|---|---|
| CN | 107710437 | B | 1/2022 |
| EP | 3 005 434 | | 4/2016 |
| KR | 10-2108139 | B1 | 8/2019 |
| WO | 2009/049744 | A1 | 4/2009 |
| WO | WO-2015/137324 | A1 | 9/2015 |
| WO | WO-2017/018529 | A1 | 2/2017 |

OTHER PUBLICATIONS

International Search Report dated Oct. 18, 2021 issued in International Application No. PCT/KR2021/008848.

Extended European Search Report dated Jul. 4, 2024 issued in European Patent Application No. 21838501.1-1211.

Hong Zhang et al: "A dual functional additive for the HTM layer in perovskite solar cells", Chemical Communications, vo 1 . 5 0, No. 3 9, pp. 5020-5022, XP055134462, (2014).

Salim NT et al: "New 3—( (2' : 2", 5' ': 2@?- terthiophene)-3" -yl) acrylic acid as active layer for organic field-effect transistor", Materials Chemistry and Physics, vol. 111, No. 1, XP022690960, (2008).

* cited by examiner

ORGANIC HOLE TRANSPORT MATERIAL DOPED WITH ACID-BASE ADDUCT, AND OPTICAL DEVICE USING SAME

CROSS-REFERENCE TO RELATED APPLICATIONS

This application is a national phase under 35 U.S.C. § 371 of PCT International Application No. PCT/KR2021/008848 which has an International filing date of Jul. 9, 2021, which claims priority to Korean Patent Application No. 10-2020-0084529, filed Jul. 9, 2020, the entire contents of each of which are hereby incorporated by reference.

TECHNICAL FIELD

The present disclosure relates to an organic hole transport material using an acid-base adduct as an additive, and an optical device using the same.

BACKGROUND ART

The need to develop environmentally friendly and sustainable energy technologies that can respond to climate change is increasing. An optical device includes both a photoelectric conversion device and an electro-optical conversion device. A solar cell, which is one of the photoelectric conversion devices, is a sustainable energy technology and is in the spotlight as a solution that can actively respond to future energy demands. The solar cell is the most basic unit of photovoltaic power generation, and it is a semiconductor device that converts solar energy into electrical energy, and uses the photovoltaic effect.

However, since the current solar cell technology is not efficient enough to meet the future energy demand, there is a need for technological innovation that exceeds the current technology level. As a next-generation solar cell, technologies based on innovative materials such as dye-sensitized solar cells, organic solar cells, quantum dot solar cells, and perovskite solar cells (PSC) have been developed.

Among these, perovskite solar cells have taken off as one of major thin film solar cells to replace the conventional silicon solar cells. The perovskite solar cell including a hole transport material, a light absorbing material, and an electron transport material. It uses the perovskite material as the light absorbing material, thus exhibiting a remarkably high photovoltaic effect.

However, the perovskite solar cells have instability to light, heat, and humidity, and thus have many limitations. For example, problems such as decomposition by humidity, thermal instability, oxygen-induced defects, and instability of a hole transport material (HTM) have been identified. In particular, when the organic hole transport material is used, the stability of the solar cell is greatly reduced.

Accordingly, various technologies have been developed to improve the stability of perovskite solar cells, but relatively few efforts have been made to develop stable hole transport materials using dopants.

DETAILED DESCRIPTION OF INVENTION

Technical Problem

Embodiments disclosed herein provide a PTAA having high efficiency and high durability.

Embodiments disclosed herein provide a perovskite optical device having high efficiency and high durability.

Embodiments disclosed herein enhance the properties of PTAA by using an acid-base adduct.

Embodiments disclosed herein use an acid-base adduct having good dispersibility as a additive for PTAA, thereby enhancing hole mobility of PTAA without any further additives.

Technical Solution

According to an embodiment, an organic hole transport material is doped with an acid-base adduct, in which the acid-base adduct is formed by an acid-base reaction between an acid and a base, and the acid includes a hydrogen ion ($H^+$).

According to an embodiment, an acid has formula $H^+X^-$, where $H^+$ corresponds to a hydrogen ion, and $X^-$ corresponds to an anion.

According to an embodiment, $X^-$ corresponds to $TFSI^-$.

According to an embodiment, the base includes any one or a combination of a primary amine, a secondary amine, and a tertiary amine.

According to an embodiment, the optical device includes the organic hole transport material described above.

Advantageous Effects

According to various embodiments, PTAA doped with an acid-base adduct having high efficiency and high durability is provided.

In addition, according to various embodiments, a perovskite optical device having high efficiency and high durability is provided.

In addition, according to various embodiments, PTAA doped with an acid-base adduct is provided.

In addition, according to various embodiments, it is possible to enhance hole mobility of PTAA without any further additives, by using an acid-base adduct having good dispersibility itself as an additive.

In addition, according to various embodiments, by doping PTAA with only one type of additive, both hole mobility and durability of PTAA can be enhanced.

The effects of the present disclosure are not limited to the effects described above, and other effects that are not mentioned above can be clearly understood to those skilled in the art based on the description provided below.

BRIEF DESCRIPTION OF DRAWINGS

The above and other objects, features and advantages of the present disclosure will become more apparent to those of ordinary skill in the art by describing in detail exemplary embodiments thereof with reference to the accompanying drawings.

MODE FOR EMBODYING INVENTION

Figure 1:
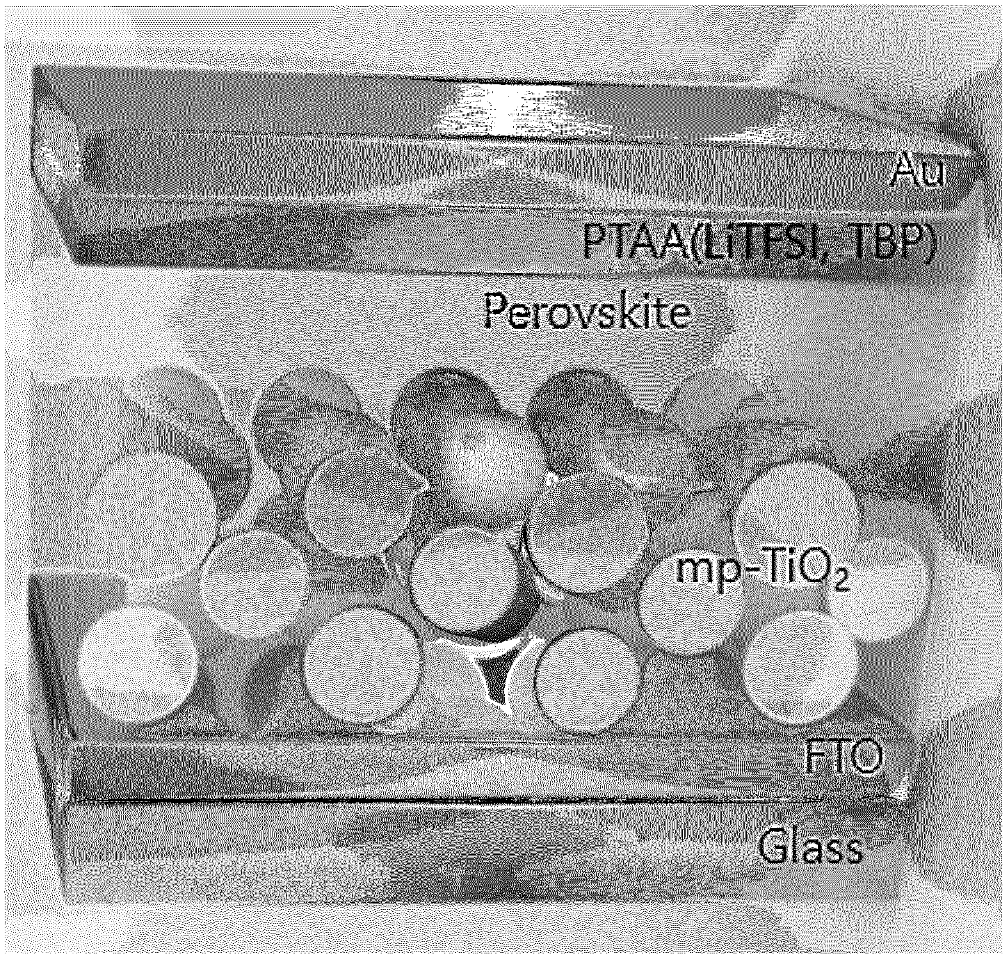
FIG. 1 is a view illustrating a perovskite optical device according to the conventional art.

The terms used in the present disclosure will be briefly described prior to describing the disclosed embodiments in detail. The terms used herein have been selected as general terms which are widely used at present in consideration of the functions of the present disclosure, and this may be altered according to the intent of an operator skilled in the art, related practice, or introduction of new technology. In addition, in specific cases, certain terms may be arbitrarily selected by the applicant, and the meaning of the terms will be described in detail in the corresponding description of the embodiments. Therefore, the terms used in the present disclosure should be defined based on the meaning of the terms and the overall content of the present disclosure rather than a simple name of each of the terms.

In the present disclosure, the singular forms "a," "an," and "the" are intended to include the plural forms as well, unless the context clearly indicates the singular forms. Further, the plural forms are intended to include the singular forms as well, unless the context clearly indicates the plural forms.

In the present disclosure, when a portion is stated as "comprising (including)" a component, unless specified to the contrary, it intends to mean that the portion may additionally comprise (or include or have) another component, rather than excluding the same.

In the present disclosure, the statement "A and/or B" means "A", or "B", or "A and B".

As used in the present disclosure, the terms "about", and the like are meant to encompass tolerances when such are present.

In the present disclosure, the expression "at least any one" included in the Markush-type description means it includes one or more elements selected from the group consisting of elements described in the Markush-type description.

In the present disclosure, the "perovskite" or "PE" refers to a material having a perovskite crystal structure, which may have various perovskite crystal structures including the crystal structure of $ABX_3$.

In the present disclosure, the "optical device" is used to refer to both a photoelectric conversion device and an electrophotic conversion device. For example, the optical device may include a solar cell, a light emitting diode (LED), a photodetector, an X-ray detector, and a laser, but not limited thereto.

In the present disclosure, the term "halide", "halogen", or "halo" refers to a material or composition containing halogen atoms belonging to group 17 of the periodic table in the form of functional groups, and may include chlorine, bromine, fluorine or iodine compound, for example.

In the present disclosure, the term "layer" refers to a form of a layer with a thickness. The layer may be porous or non-porous. By "(being) porous", it means having a porosity. The layer may have a bulk form as a whole or may correspond to a single crystal thin film, although not limited thereto.

In the present disclosure, when it is described that a certain member is positioned "on" another member, unless specifically stated otherwise, this includes not only when the certain member is in contact with another member, but also when the two members are intervened with yet another member that may be present therebetween.

In the present disclosure, when "efficiency" is simply mentioned without any additional explanation, it means that the corresponding efficiency is the power conversion efficiency (PCE).

Hereinafter, specific details for the practice of the present disclosure will be described in detail with reference to the accompanying drawings. However, in the following description, detailed descriptions of well-known functions or configurations will be omitted when it may make the subject matter of the present disclosure rather unclear.

Advantages and features of the disclosed embodiments and methods of accomplishing the same will be apparent by referring to embodiments described below in connection with the accompanying drawings. However, the present disclosure is not limited to the embodiments disclosed below, and may be implemented in various forms different from each other, and the present embodiments are merely provided to make the present disclosure complete, and to fully disclose the scope of the disclosure to those skilled in the art to which the present disclosure pertains.

In the accompanying drawings, the same or corresponding components are assigned the same reference numerals. In addition, in the following description of the embodiments, duplicate descriptions of the same or corresponding components may be omitted. However, even if descriptions of components are omitted, it is not intended that such components are not included in any embodiment.

An optical device according to an embodiment of the present disclosure may include a first electrode, a first charge transport layer formed on the first electrode, a perovskite layer formed on the first charge transport layer, a second charge transport layer formed on the perovskite layer, and a second electrode formed on the second charge transport layer.

For example, when the optical device is used for a solar cell having an n-i-p structure, the optical device may have a structure in which the first electrode, the electron transport layer, the perovskite layer, the hole transport layer, and the second electrode are sequentially stacked. Alternatively, when the optical device corresponds to a solar cell having a p-i-n structure, the solar cell may have a structure in which the first electrode, the hole transport layer, the perovskite layer, the electron transport layer, and the second electrode are sequentially stacked.

For example, the optical device may have a planar structure, a bi-layer structure, or a meso-superstructure structure. The shape of the electrode, the charge transport layer, and the perovskite layer may be modified according to the structure of the optical device.

For example, when the optical device has a bi-layer structure, the perovskite layer may have a bi-layer structure formed into a shape of a layer by filling porous $TiO_2$ with perovskite. The bi-layer may refer to a structure formed of a first layer of a $TiO_2$:Perovskite mixed layer in which all pores of the porous $TiO_2$ are filled with perovskite, and a second layer of a pure perovskite layer thereon.

The electrode may include a first electrode and/or a second electrode and may be an anode or a cathode. The electrode may be an anode or a cathode. When the first electrode is an anode, the second electrode may be a cathode. For example, the electrode may be a conductive oxide such as indium-tin oxide (ITO) or indium-zinc oxide (IZO), fluorine-doped tin oxide (FTO), or the like. Alternatively, the electrode may include a material selected from the group consisting of silver (Ag), gold (Au), magnesium (Mg), aluminum (Al), platinum (Pt), tungsten (W), copper (Cu), molybdenum (Mo), nickel (Ni), palladium (Pd), chromium (Cr), calcium (Ca), samarium (Sm), lithium (Li), and combinations thereof. Alternatively, the electrode may correspond to a conductive material being doped on a flexible and transparent material such as plastic, such as terephthalate (PET), polyethylene naphthelate (PEN), polyperopylene (PP), polyimide (PI), polycarbornate (PC), polystylene (PS), and polyoxyethylene (POM), and the like.

The electrode may correspond to a material commonly used as an electrode material for a front electrode or a rear electrode in the optical device. The electrode may be a material selected from one or more of gold, silver, platinum, palladium, copper, aluminum, carbon, cobalt sulfide, copper sulfide, nickel oxide, and a combination thereof, but is not limited thereto. For example, the electrode may correspond to any one or two or more of inorganic conductive electrodes selected from fouorine doped tin oxide (FTO), indium doped tin oxide (ITO), ZnO, carbon nanotube (CNT), graphene, and the like, or organic conductive electrodes such as PEDOT:PSS, but is not limited thereto.

For the charge transport layer, an electron transport layer (ETL) or a hole transport layer (HTL) may be formed on the first electrode. When the first charge transport layer is the electron transport layer, the second charge transport layer may correspond to the hole transport layer. Alternatively, when the first charge transport layer is the hole transport layer, the second charge transport layer may correspond to the electron transport layer.

The electron transport layer may correspond to a semiconductor including an "n-type material". The "n-type material" means an electron-transport material. The electron-transport material may be a single electron-transport compound or elemental material, or two or more electron-transport compounds or a mixture of elemental materials. The electron-transport compound or elemental material may be undoped, or doped with one or more dopant elements.

For example, the electron transport layer may be an electron conductive organic material layer or an electron conductive inorganic material layer. The electron conductive organic material may be an organic material used as an n-type semiconductor in a typical organic solar cell. For example, the electron conductive organic material may include fullerenes (C60, C70, C74, C76, C78, C82, C95), fullerene-derivatives including PCBM ([6,6]-phenyl-C61butyric acid methyl ester) and C71-PCBM, C84-PCBM, and PC70BM ([6,6]-phenyl C70-butyric acid methyl ester)), PBI (polybenzimidazole), PTCBI (3,4,9,10-perylenetetracarboxylic bisbenzimidazole), F4-TCNQ (tetra uorotetracyanoquinodimethane), or a mixture thereof, but is not limited thereto. The electron conductive inorganic material may be an electron conductive metal oxide used for electron transfer in a typical quantum dot-based solar cell, dye-sensitized solar cell, or perovskite-based solar cell. In an embodiment, the electron conductive metal oxide may be an n-type metal oxide semiconductor. For example, the n-type metal oxide semiconductor may be one or more materials selected from Ti oxide, Zn oxide, In oxide, Sn oxide, W oxide, Nb oxide, Mo oxide, Mg oxide, Ba oxide, Zr oxide, Sr oxide, Yr oxide, La oxide, V oxide, Al oxide, Y oxide, Sc oxide, Sm oxide, Ga oxide, In oxide, and SrTi oxide, a mixture thereof, or a composite thereof, but is not limited thereto.

The electron transport layer may be a dense layer (dense film) or a porous layer (porous film). The dense electron transport layer may be a film of the electron conductive organic material described above, or a dense film of the electron conductive inorganic material described above. The electron transport layer of the porous film may be a porous film formed of particles of the electron conductive inorganic material described above.

The hole transport layer may correspond to a semiconductor including a "p-type material". The "p-type material" means a hole transport material. The hole transport material may be a single hole transport compound or elemental material, or a mixture of two or more hole transport compounds or elemental materials. The hole transport compound or elemental material may be undoped, or doped with one or more dopant elements. The hole transport material may be an organic hole transport material, an inorganic hole transport material, or a combination thereof.

The hole transport layer may be manufactured by a solution process. The hole transport layer may be a thin film of the organic hole transport material. The thickness of the hole transport layer thin film may be 10 nm to 500 nm, but is not limited thereto.

The hole transport material may correspond to the organic hole transport material, and may specifically correspond to mono-molecular organic hole transport material or polymer organic hole transport material (hole conductive organic material). For the polymer organic hole transport material, one or two or more materials selected from thiophene-based material, para-phenylenevinylene-based material, carbazole-based material and triphenylamine-based material may be included.

Mono- to low-molecular organic hole transport materials may include one or two or more selected from pentacene, coumarin 6 (coumarin 6, 3-(2-benzothiazolyl)-7-(diethylamino) coumarin), ZnPC (zinc phthalocyanine), CuPC (copper phthalocyanine), TiOPC (titanium oxide phthalocyanine), Spiro-MeOTAD (2,2',7,7'-tetrakis(N,N-p-dimethoxyphenylamino)-9,9'-spirobifluorene), F16CuPC (copper (II) 1,2,3,4,8,9,10,11,15,16,17,18,22,23,24,25-hexadecafluoro29H,31H-phthalocyanine), SubPc (boron subphthalocyanine chloride) and N3(cis-di(thiocyanato)-bis(2,2'-bipyridyl-4,4'-dicarboxylic acid)-ruthenium(II)), but is not limited thereto.

The polymer organic hole transport material may include one or two or more materials selected from P3HT (poly[3-hexylthiophene]), MDMO-PPV (poly[2-methoxy-5-(3',7'-dimethyloctyloxyl)]-1,4-phenylene vinylene), MEH-PPV (poly[2-methoxy-5-(2"-ethylhexyloxy)-p-phenylene vinylene]), P30T (poly(3-octyl thiophene)), POT (poly(octyl thiophene)), P3DT (poly(3-decyl thiophene)), P3DDT (poly (3-dodecyl thiophene), PPV(poly(p-phenylene vinylene)), TFB (poly(9,9'-dioctylfluorene-co-N-(4-butylphenyl)diphenyl amine), Polyaniline, SpiroMeOTAD ([2,22',7,77'-tetrkis (N,N-di-p-methoxyphenyl amine)-9,9,9'-spirobi fluorine]), PCPDTBT (Poly[2,1,3-benzothiadiazole-4,7-diyl[4,4-bis(2-ethylhexyl-4H-cyclopenta [2,1-b:3,4-b']dithiophene-2,6-diyl]], Si-PCPDTBT (poly[(4,4'-bis(2-ethylhexyl)dithieno [3,2-b:2',3'-d]silole)-2,6-diyl-alt-(2,1,3-benzothiadiazole)-4,7-diyl]), PBDTTPD (poly((4,8-diethylhexyloxyl)benzo([1,2-b:4,5-b']dithiophene)-2,6-diyl)-alt-((5-octylthieno[3,4-c] pyrrole-4,6-dione)-1,3-diyl)), PFDTBT (poly[2,7-(9-(2-ethylhexyl)-9-hexyl-fluorene)-alt-5,5-(4',7,-di-2-thienyl-2',1',3'-benzothiadiazole)]), PFO-DBT (poly[2,7-.9,9-(dioctyl-fluorene)-alt-5,5-(4',7'-di-2-.thienyl-2',1',3'-benzothiadiazole)]), PSiFDTBT (poly[(2,7-dioctylsilafluorene)-2,7-diyl-alt-(4,7-bis(2-thienyl)-2,1,3-benzothiadiazole)-5,5'-diyl]), PSBTBT (poly[(4,4'-bis(2-ethylhexyl)dithieno[3,2-b:2',3'-d]silole)-2,6-diyl-alt-(2,1,3-benzothiadiazole)-4,7-diyl]), PCDTBT (Poly[[9-(1-octylnonyl)-9H-carbazole-2,7-diyl]-2,5-thiophenediyl-2,1,3-benzothiadiazole-4,7-diyl-2,5-thiophenediyl]), PFB (poly(9,9'-dioctylfluorene-co-bis(N,N'-(4,butylphenyl))bis(N,N'-phenyl-1,4-phenylene)diamine), F8BT (poly(9,9'-dioctylfluorene-co-benzothiadiazole), PEDOT (poly(3,4-ethylenedioxythiophene)), PEDOT:PSS (poly(3,4-ethylenedioxythiophene) poly(styrenesulfonate)), PTAA (poly(triarylamine)), Poly(4-butylphenyldiphenyl-amine), and copolymers thereof, but is not limited thereto.

The additional details of the hole transport layer will be described elsewhere.

The electron transport layer or the hole transport layer may correspond to a buffer layer or may include a buffer layer. The surface of the electron transport layer or hole transport layer may be modified using doping. The electron transport layer or the hole transport layer may be formed by being applied or coated in a film form onto one surface of the electrode through spin coating, dip coating, inkjet printing, gravure printing, spray coating, bar coating, gravure coating, brush painting, thermal evaporation, sputtering, E-Beam, screen printing, blade process, and the like.

The perovskite layer may be formed in direct contact with the first electrode. Alternatively, the perovskite layer may be formed in direct contact with the electron transport layer or the hole transport layer. The perovskite layer includes perovskite.

The perovskite layer may be formed through various processes including vapor deposition process, solution process, or the like. The perovskite layer may be formed using a vapor deposition process. The vapor deposition process may correspond to a process of depositing a material onto a surface of a target object (e.g., a substrate) by supplying the material in a vaporized or plasma state into a vacuum chamber. The perovskite layer may be formed through a coating process during a solution process. The coating process may be selected from the group consisting of spin coating, bar coating, nozzle printing, spray coating, slot die coating, gravure printing, inkjet printing, screen printing, electrohydrodynamic jet printing, electrospray, and combinations thereof, although not limited thereto.

For example, a perovskite may contain a monovalent organic cation, a divalent metal cation and a halogen anion. In an embodiment, the perovskite of the present invention may satisfy the following chemical formula.

$AMX_3$ [Formula 1]

where A is a monovalent cation, and may correspond to organic ammonium ion, amidinium group ion, or a combination of organic ammonium ion and amidinium ion.

For example, the organic cation as A may have the formula $(R_1R_2R_3R_4N)^+$. In this case, $R_1$ to $R_4$ may correspond to hydrogen, unsubstituted or substituted C1 to C20 alkyl, or unsubstituted or substituted aryl.

For example, the organic cation as A may have the formula $(R_5NH_3)^+$, where $R_5$ may correspond to hydrogen or substituted or unsubstituted C1 to C20 alkyl.

For example, the organic cation as A may have the formula $(R_6R_7N{=}CH{-}NR_8R_9)^+$, where $R_6$ to $R_9$ may correspond to hydrogen, methyl, or ethyl.

In addition, A may be a monovalent metal ion, and correspond to an alkali metal ion.

For example, the monovalent metal ion as A may correspond to Li+, Na+, K+, Rb+, or Cs+ ion.

In addition, A may correspond to a combination of the monovalent organic cation and the monovalent metal ion.

For example, A may correspond to a form of the monovalent organic cation doped with the monovalent metal ion. The monovalent metal ion that is the doped metal ion may include an alkali metal ion, and the alkali metal ion may be one or two or more selected from Li+, Na+, K+, Rb+, and Cs+ ions.

M may be a divalent metal ion. For example, M includes a metal cation selected from the group consisting of $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$ and $Yb^{2+}$ and combinations thereof, but is not limited thereto.

X may correspond to a halogen ion. For example, the halogen ion includes halogen ion selected from the group consisting of I—, Br—, F—, Cl—, and combinations thereof, but is not limited thereto.

For example, the perovskite may be any one or a mixture of two or more selected from $CH_3NH_3PbI_3$ (methylammonium lead iodide, $MAPbI_3$) and $CH(NH_2)_2PbI_3$ (formamidinium lead iodide, $FAPbI_3$).

In addition, X may correspond to an oxygen ion.

Hereinafter, the hole transport material included in the hole transport layer according to an embodiment will be described in more detail.

The optical device is exposed to strong sunlight and heated to 80° C. or higher, so it requires a material that ensures thermal stability. In particular, the organic hole transport material is known to be the most vulnerable to heat. Accordingly, an object is to provide an organic hole transport material capable of keeping stability from deterioration factors, while maintaining high efficiency.

The hole transport material included in the hole transport layer may transport holes from the perovskite layer to the electrode. The hole transport material may be an organic hole transport material, an inorganic hole transport material, or a layered material thereof. In an embodiment, the hole transport layer may include an organic hole transport material having excellent hole transporting properties. The organic hole transport layer may include an organic hole transport material, and specifically, may include a monomolecular organic hole transport material or a polymer organic hole transport material (hole conductive organic material).

According to an embodiment, the organic hole transport material may correspond to a polymer hole transport material including an acid-base adduct as an additive, and may correspond to PTAA (poly(triarylamine)), for example.

While the widely used monomolecule-based hole transport material such as spiro-MeOTAD crystallizes at a relatively low temperature, thus changing electrical properties and reducing the efficiency of the device, the polymer hole transport material such as PTAA has higher thermal stability than the monomolecular material.

Since organic-based hole transport materials have low conductivity, bis(triuoromethane)sulfonimide lithium salt (hereinafter "LiTFSJ"), 4-tert-butylpyridine (hereinafter "tBP"), and the like may be doped or added to PTAA as a dopant or additive to enhance properties such as hole mobility. LiTFSI acts as a p-dopant to increase hole mobility of the hole transport material, and tBP prevents aggregation of LiTFSI such that LiTFSI is uniformly dispersed in the hole transport material.

When LiTFSI is used as an additive to enhance the electrostatic mobility of PTAA, since it has low dispersibility in organic solvents, it is necessary to enhance dispersibility by using tBP. When used, the tBP has a positive effect on efficiency because it enhances dispersibility, but it can cause a decrease in efficiency under high-temperature stress.

In other words, while LiTFSI and tBP as additives may have the positive effect on the hole transport material, they may correspond to the main compositions that cause the instability of the optical device. LiTFSI is hygroscopic, so it can absorb moisture and accelerate the decomposition of perovskite. tBP may easily evaporate to form voids in the hole transport layer, or it may react with the perovskite and induce chemical corrosion of the perovskite.

Therefore, in order to provide a solution to the problem described above, for the hole transport material according to an embodiment, an acid-base adduct having good dispersibility itself may be used as an additive to the polymer hole transport material such as PTAA, to increase the hole mobility in the hole transport material and enhance the durability of the hole transport material at the same time. This new acid-base adduct replaces LiTFSI, and can not only enhance hole mobility, but also prevent a phenomenon in which efficiency is lowered under high temperature conditions since it has a good dispersibility itself in organic solvent and also does not require any further additives.

According to an embodiment, the acid-base adduct added to the polymer hole transport material, that is, to PTAA for example, may be prepared by an acid-base reaction between an acid and a base.

The acid may include hydrogen ions ($H^+$). For example, the acid may mean a material that is ionized to donate a hydrogen ion $H^+$ or a material that receives a lone pair of electrons. The acid may be configured to satisfy Formula 2, and in this case, $H^+$ may correspond to a hydrogen ion, and $X^-$ may correspond to an anion.

$$H^+X^- \quad \text{[Formula 2]}$$

For example, the acid according to an embodiment may be any one of HTFSI, HCl, HBr, and HI or a combination thereof.

For example, the acid according to an embodiment may be configured to satisfy Formula 3.

[Formula 3]

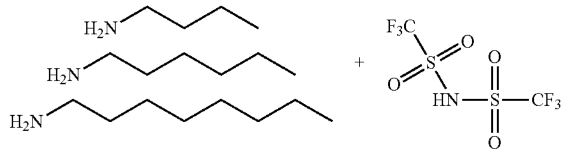

Figure 3:
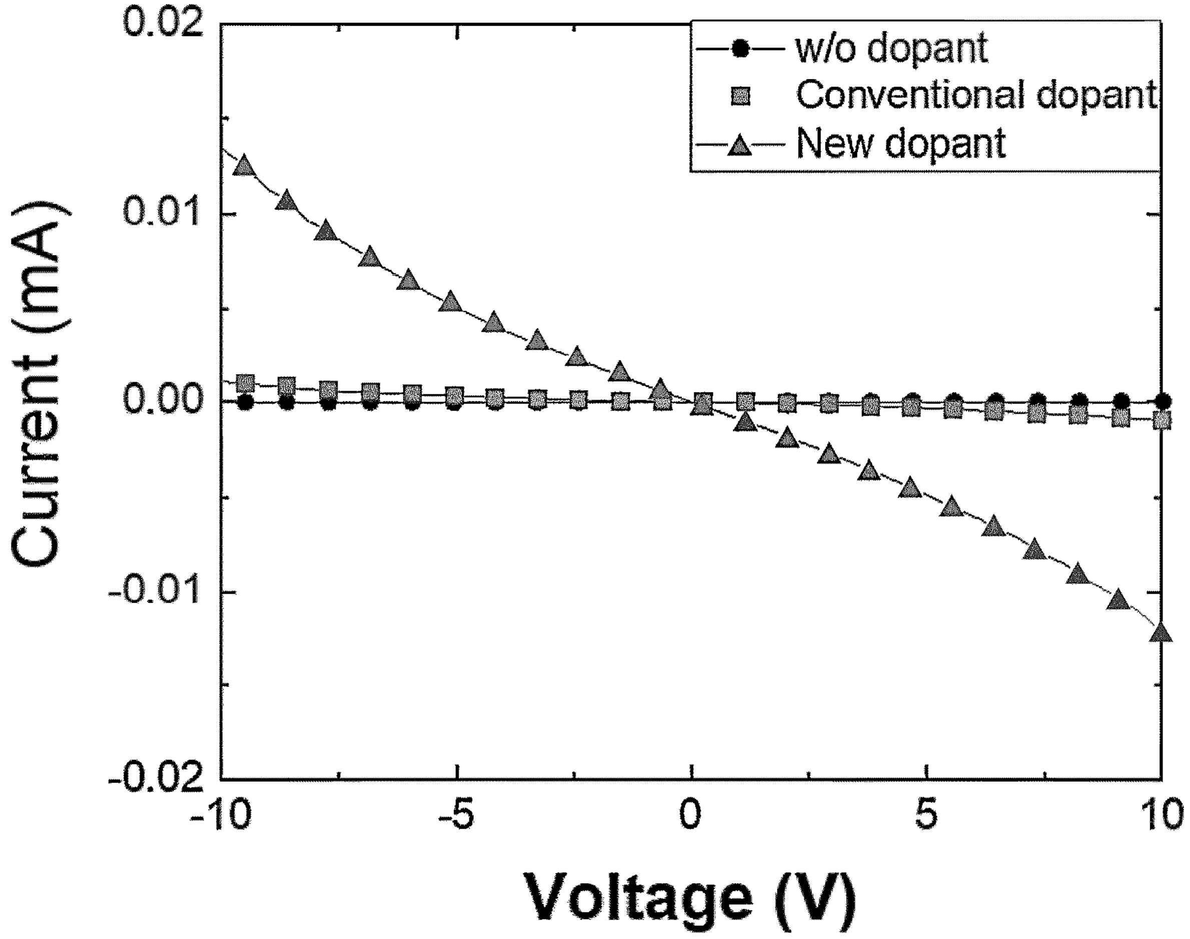
FIG. 3 is a current versus voltage characteristic graph according to an embodiment and a comparative example of the present disclosure.

$X^-$ contained in the acid can play an important role in the charge transporting properties of hole transport material as well as the performance of solar cells. For example, the conductivity properties of doped p-type conductive polymers may be greatly affected by $X^-$. For example, $X^-$ may correspond to $TFSI^-$. The $TFSI^-$ anion can promote the charge collection process in the hole transport material layer as illustrated in FIG. 3 due to its high charge conductivity.

The base may mean a material that is ionized to receive a hydrogen ion $H^+$, or a material that donates a lone pair of electrons. For example, the base according to an embodiment may include a polymer. For example, the polymer may correspond to an amine polymer. The amine polymer may be any one of a primary amine, a secondary amine, and a tertiary amine, or a combination thereof.

In an embodiment, by using a large cation contained in the base, such as an amine polymer (e.g., primary amine, secondary amine, or tertiary amine), the stability of the hole transport material as well as the stability of the perovskite optical device can be greatly improved. This may be related to the fact that, according to the "steric effect", large-sized cations such as amine polymers migrate much more slowly in the solid film compared to small cations such as lithium ions contained in the conventional LiTFSI.

The acid-base adduct according to an embodiment of the present disclosure may be an acid-base adduct $CH_3(CH_2)_7NH_3^+TFSI^-$ resulting from a reaction of $CH_3(CH_2)_7NH_2$ with HTFSI, which itself has good dispersibility in organic solvents and can be doped with PTAA to provide high-efficiency PSC.

According to an embodiment, the concentration of the acid-base adduct may correspond to 0 to 3 equivalents compared to PTAA.

According to an embodiment, the solution method may be used to form the hole transport layer doped with the acid-base adduct. For example, PTAA may be dissolved at a concentration of 10 mg/mL by using toluene, chlorobenzene, or chloroform as a solvent, and a mixture solution can be prepared by adding 0.8 mg of $CH_3(CH_2)_7NH_2$ (base), and 1.7 mg of HTFSI (acid). This mixture solution can be spin-coated to form a hole transport layer on the perovskite film.

Example 1: FTO(TEC8)/Mp-$TiO_2$/Perovskite/PTAA (Acid-Base Adduct)/Au

Figure 2:
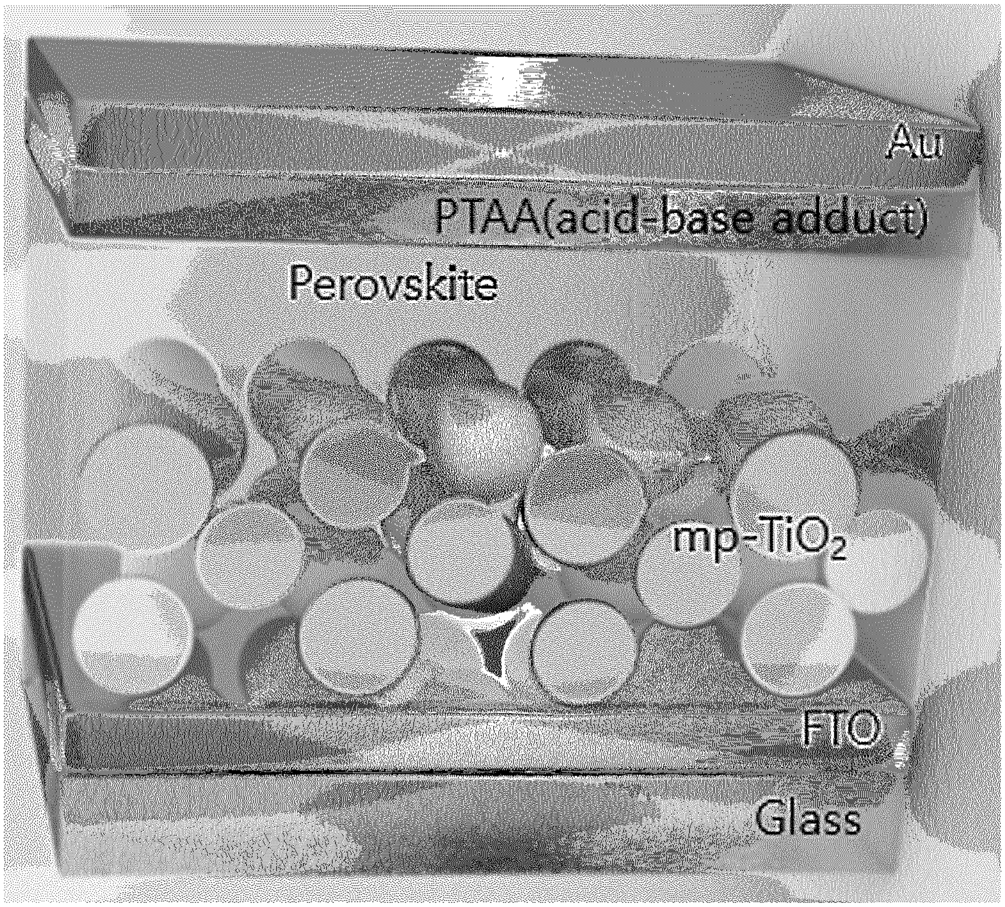
FIG. 2 is a diagram illustrating a perovskite optical device according to an embodiment of the present disclosure.

The optical device according to Example 1 of the present disclosure has a bi-layer structure as illustrated in FIG. 2. Specifically, the optical device includes FTO(TEC8)/mp-$TiO_2$/perovskite/PTAA doped with $CH_3(CH_2)_7NH_3^+TFSI^-$ (acid-base adduct)/Au.

Comparative Example 1: FTO(TEC8)/mp-$TiO_2$/Perovskite/PTAA(LiTFSI, tBP)/Au

The optical device according to Comparative Example 1 has a bi-layer structure as illustrated in FIG. 1. Specifically, the optical device includes FTO(TEC8)/mp-$TiO_2$/perovskite/PTAA doped with LiTFSI and tBP/Au.

Performance Comparison

The performance of the optical device was evaluated by the following method with the perovskite optical devices prepared in Example 1 and Comparative Example 1, and the results are shown in Tables 1 to 3 below.

1) Current-voltage characteristics: Open circuit voltage ($V_{OC}$), short circuit current density ($J_{sc}$) and factor factor (FF) were measured with the artificial solar device (ORIEL class A solar simulator, Newport, model 91195A) and the source-meter (Kethley, model 2420).

2) Photoelectric conversion efficiency (PCE): The perovskite optical devices prepared in Example 1 and Comparative Example 1 were exposed to a light source having a wavelength of 280 to 2500 nm, at a constant temperature and humidity condition of a sunlight intensity of 1,000 W/m2, a temperature of 85° C. and a humidity of 85%, and the PCE values were measured.

3) Stability: The measured PCE value was substituted into the following formula to evaluate the stability.

$$\text{Formula}=(\eta_1/\eta_0)\times 100$$

In the above formula, $\eta_0$ represents the initial photoelectric conversion efficiency of the perovskite optical device immediately after starting the stability test, and $\eta_1$ represents the photoelectric conversion efficiency after exposing the same perovskite solar cell at 85° C. and 85% condition for 100 hours.

4) Charge transfer characteristics of the hole transport layer according to additives: The charge transfer characteristics, which depend on the additives of the hole transport layer (Example: PTAA), were measured as current-voltage characteristics (see FIG. 3).

TABLE 1

| Comparison of efficiencies of photoelectric conversion devices | | | | |
|---|---|---|---|---|
| | $J_{sc}$ (mA/cm$^2$) | $V_{oc}$ (V) | FF | PCE (%) |
| Comparative Example 1 | 26 | 1.05 | 81 | 22.11 |
| Example 1 | 26 | 1.06 | 84 | 23.15 |

According to Table 1, it can be confirmed that the photoelectric conversion device according to Example 1 exhibits higher power conversion efficiency than Comparative Example 1.

TABLE 2

| Comparison of stabilities of photoelectric conversion devices (85° C., 85% conditions, efficiency after 100 hours) | | | |
|---|---|---|---|
| | Initial Efficiency | Final Efficiency | Efficiency Retention (%) |
| Comparative Example 1 | 22.11 | 20 | 90.45 |
| Example 1 | 23.15 | 23 | 99.35 |

According to Table 2, it can be confirmed that the photoelectric conversion device according to Example 1 has significantly enhanced device stability than Comparative Example 1.

TABLE 3

| Charge transfer characteristics of PTAA (see FIG. 3) | | |
|---|---|---|
| | Resistance (Ω) | Conductivity (S) |
| PTAA alone (w/o dopant) | 251M | 3n |
| Comparative Example 1 (Conventional dopant) | 26M | 38n |
| Example 1 (New dopant) | 1M | 1000n |

In Table 3, the charge transfer characteristics according to the doping ability of the hole transport layer are expressed as resistance and conductivity values. Referring to Table 3, it can be confirmed that the PTAA according to Example 1 has significantly enhanced charge transfer characteristics than those of Comparative Example 1 or undoped PTAA.

The preferred embodiments of the present invention described above are disclosed for purposes of illustration, and those skilled in the art with ordinary knowledge of the present invention will be able to make various modifications, changes and additions within the spirit and scope of the present invention, and such modifications, changes and additions should be construed to be included in a scope of the claims.

It should be understood that those of ordinary skill in the art to which the present disclosure pertains can make various substitutions, modifications and changes without departing from the technical spirit of the present disclosure, and thus, the present disclosure is not limited by the embodiments described above and the accompanying drawings.

The invention claimed is:

1. An organic hole transport material doped with an acid-base adduct, wherein the acid-base adduct is formed by an acid-base reaction between an acid and a base, the acid contains a hydrogen ion ($H^+$), and the base includes one or more of a primary amine, a secondary amine, or a tertiary amine, such that the acid-base adduct includes a conjugate base of the acid bonded to a conjugate acid of the base, such that the conjugate acid includes the hydrogen ion and the one or more of the primary amine, the secondary amine, or the tertiary amine.

2. The organic hole transport material according to claim 1, wherein the acid has a formula $H^+X^-$, the $H^+$ corresponds to the hydrogen ion, and the $X^-$ corresponds to an anion.

3. The organic hole transport material according to claim 2, wherein the $X^-$ corresponds to $(CF_3SO_2)_2N$ (bis(triuoromethane)sulfonimide ($TFSI^-$).

4. An optical device comprising the organic hole transport material according to claim 1.

5. An organic hole transport material doped with an acid-base adduct, wherein the acid-base adduct corresponds to $CH_3(CH_2)_7NH_3^+$ $[(CF_3SO_2)_2N]$ (bis(triuoromethane) sulfonimide ($TFSI^-$), and the organic hole transport material corresponds to poly(triarylamine) (PTAA).

6. An optical device comprising the organic hole transport material according to claim 5.

* * * * *